(12) United States Patent
Heikkila et al.

(10) Patent No.: US 7,560,971 B2
(45) Date of Patent: Jul. 14, 2009

(54) LEVEL SHIFT CIRCUIT WITH POWER SEQUENCE CONTROL

(75) Inventors: Walter W. Heikkila, Burnsville, MN (US); Michael T. Johnson, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 31 days.

(21) Appl. No.: 11/956,058

(22) Filed: Dec. 13, 2007

(65) Prior Publication Data

US 2009/0153218 A1  Jun. 18, 2009

(51) Int. Cl.
*H03L 5/00* (2006.01)
(52) U.S. Cl. ............................. 327/333; 326/68; 326/81
(58) Field of Classification Search ................. 327/143, 327/333; 326/68, 80, 81; 365/189.11
See application file for complete search history.

(56) References Cited

U.S. PATENT DOCUMENTS

| | | | |
|---|---|---|---|
| 5,332,936 A * | 7/1994 | Nakao | ........................... 326/68 |
| 5,486,785 A | 1/1996 | Blankenship | |
| 5,764,082 A * | 6/1998 | Taylor | ........................... 326/81 |
| 5,969,554 A | 10/1999 | Chan et al. | |
| 6,621,299 B1 | 9/2003 | Randazzo et al. | |
| 6,785,107 B1 | 8/2004 | Schmitt | |
| 6,894,537 B1 | 5/2005 | Wert | |
| 6,975,155 B2 | 12/2005 | Lee | |
| 7,005,908 B2 | 2/2006 | Lee et al. | |
| 7,142,035 B2 * | 11/2006 | Honda | ......................... 327/333 |
| 2005/0146355 A1 | 7/2005 | Kase et al. | |
| 2007/0014061 A1 | 1/2007 | Chang et al. | |
| 2008/0048754 A1 * | 2/2008 | Woo et al. | .................... 327/333 |

* cited by examiner

*Primary Examiner*—Long Nguyen
*Assistant Examiner*—Sibin Chen
(74) *Attorney, Agent, or Firm*—McDonnell, Boehnen, Hulbert and Berghoff LLP

(57) ABSTRACT

A level shift circuit for providing predictable outputs when VDDH is powering up and minimizing DC current when VDDL is powering up. The level shift circuit may have a control circuit that includes a first inverter with an input coupled to VDDL, one or more diodes coupled between the first inverter and its powering voltage supply, a second inverter coupled to an output of the first inverter (optionally coupled to its voltage supply via one or more diodes), a third inverter coupled to an output of the second control inverter, an NMOS transistor coupled to an output of the third inverter that forces the output of the level shift circuit to the ground voltage when enabled, and a PMOS transistor coupled to an output of the third inverter that disconnects a portion of the level shift circuit, and thus the output of the level shift circuit, from VDDH when disabled.

20 Claims, 5 Drawing Sheets

US 7,560,971 B2

LEVEL SHIFT CIRCUIT WITH POWER SEQUENCE CONTROL

GOVERNMENT RIGHTS

The United States Government has acquired certain rights in this invention pursuant to Contract No. DTRA01-03-D-0018-0007, awarded by the Defense Threat Reduction Agency

FIELD OF THE INVENTION

The present invention relates generally to semiconductor circuits, and more particularly to level shift circuits.

BACKGROUND

Integrated circuits such as static random access memory (SRAM) circuits and application-specific integrated circuits (ASICs) may require use of two different power supply voltages. For example, an integrated circuit may use a high voltage supply to power high voltage input and/or output circuits such as tri-state buffers, and a low voltage supply to power low voltage internal circuits such as memory cells and logic gates. In this respect, an integrated circuit may use a level shift circuit to translate signals between the high voltage circuits and low voltage circuits.

FIG. 1 is a schematic diagram of a typical level shift circuit 100 that translates a low voltage signal to a high voltage signal. As shown, the level shift circuit 100 may be coupled to a ground voltage supply VSS, a low voltage supply VDDL, and a high voltage supply VDDH.

The level shift circuit 100 may include a first NMOS transistor 102, a second NMOS transistor 104, a first PMOS transistor 106, and a second PMOS transistor 108, each of which is powered by the high voltage supply VDDH. Additionally, the traditional level shift circuit 100 may include one or more inverters 110 that are powered by the low voltage supply VDDL. Additionally yet, the level circuit 100 may have an input node IN that receives low voltage signals, a first output node OE that outputs high voltage signals, and a second output node OEN that also outputs high voltage signals and is complementary of the first output node OE.

As shown, the first NMOS transistor 102 may have a gate coupled to a non-inverted version of the input node IN, a source coupled to the ground voltage supply VSS, and a drain coupled to the first output node OE. As shown, the gate may be coupled to the input node IN through a complementary pair of inverters 110, such that the first NMOS transistor 102 receives a non-inverted version of the input node IN. Alternatively, however, the gate of the first NMOS transistor 102 may be coupled directly to the input node IN. The second NMOS transistor 104 may have a gate coupled to an inverted version of the input node IN, a source coupled to the ground voltage supply VSS, and a drain coupled the second output node OEN. As shown, the gate of the second NMOS transistor 104 may be coupled to the input node IN through a single inverter 110 coupled in series with the input node IN, such that the second NMOS transistor 104 receives an inverted version of the input node IN.

The first PMOS transistor 106 may have a gate coupled to the second output node OEN, a source coupled to the high voltage supply VDDH and a drain coupled to the first output node OE. The second PMOS transistor 108 may have a gate coupled to the first output node OE, a source coupled to the high voltage supply VDDH, and a drain coupled to the second output node OEN.

As a result of the above configuration, the transistors 102, 104, 106, and 108 are cross-coupled. More particularly, the drain of the first NMOS transistor 102, the drain of the first PMOS transistor 106, and the gate of the second PMOS transistor 108 are coupled together at the first output node OE. Similarly, the drain of the second NMOS transistor 104, the drain of the second PMOS transistor 108, and the gate of the first PMOS transistor 106 are coupled together at the second output node OEN. Preferably, the NMOS transistors 102 and 104 will have a larger drive capability than the PMOS transistors 106 and 108.

Operation of the level shift circuit 100 with both the high voltage supply VDDH and the low voltage supply VDDL powered up will now be described. In one example, the input IN node of the level shift circuit may transition from a logic "1" value in the low voltage domain of approximately VDDL to a logic "0" value in the low voltage domain of approximately VSS. As a result, the first NMOS transistor 102 may be disabled and the second NMOS transistor may be enabled, thus pulling the second output node OEN to the ground voltage of approximately VSS. In turn, the first PMOS transistor 106, which has its gate coupled to the second output node OEN, may be enabled. The enabled first PMOS transistor 106 may then pull the first output node OE to a logic "1" value in the high voltage domain of approximately VDDH, thus disabling the second PMOS transistor 108, which has its gate coupled to the first output node OE. As a result, the first output node OE may be stable at a logic "1" value in the high voltage domain of approximately VDDH, and the second output node OEN may be stable at a logic "0" value in the high voltage domain of approximately VSS.

In another example, the input IN node of the level shift circuit may transition from a logic "0" value in the low voltage domain of VSS to a logic "1" value in the low voltage domain of approximately VDDL. As a result, the second NMOS transistor may be disabled and the first NMOS transistor 102 may be enabled, thus pulling the first output node OE to the ground voltage of approximately VSS. In turn, the second PMOS transistor 108, which has its gate coupled to the first output node OE, may be enabled. The enabled second PMOS transistor 108 may then pull the second output node OEN to a logic "1" value in the high voltage domain of approximately VDDH, thus disabling the first PMOS transistor 106, which has its gate coupled to the second output node OEN. As a result, the first output node OE may be stable at a logic "0" value in the high voltage domain of approximately VSS, and the second output node OEN may be stable at a logic "1" value in the high voltage domain of approximately VDDH.

In the level shift circuit 100 described above, a problem may occur if the high voltage supply VDDH is enabled, and thus powering up, while the low voltage supply VDDL is still disabled. In this situation, the output nodes of the level shift circuit 100 may be at unpredictable voltage levels. For example, when the high voltage supply VDDH is powering up and the low voltage supply is the ground voltage VSS, the first output node OE could either be at a high logic "1" voltage of VDDH or a high logic "0" voltage of VSS, regardless of the state of the input node IN. In turn, the second output node OEN, as a complementary node, would be in the opposite state of the first output node OE.

The unpredictable nature of the level shift circuit's output voltage levels described above may be undesirable, especially when the level shift circuit's outputs are controlling a tri-state output buffer that is driving a common bus with additional tri-state buffers. In this respect, if the tri-state output buffer is improperly enabled by the level shift circuit, the tri-state output buffer may force a voltage on the common bus that is opposite to other voltage on the common bus, thus causing a high current condition on the common bus. Accordingly, a level shift circuit that outputs predictable voltage levels when its high voltage supply is powering up and it low voltage supply is disabled, while avoiding DC currents, is desirable.

SUMMARY

One aspect of the present invention may take the form of a first level shift circuit. The first level shift circuit may include (a) a first transistor having a gate coupled to a first input, a source coupled to a first voltage supply, and a drain coupled to a first output, (b) a second transistor having a gate coupled to second input that has an inverted logic state of the first input, a source coupled to the first voltage supply, and a drain coupled to a second output, (c) a third transistor having a gate coupled to the second output and a drain coupled to the first output, (d) a fourth transistor having a gate coupled to the first output, a source coupled to a second voltage supply, and a drain is coupled to the second output, and (e) a first control circuit. The first control circuit may include (1) a first control inverter, having an input coupled to a non-inverted version of a third voltage supply, (2) a first control transistor having a gate coupled to an output of the first control inverter, a source coupled to the first voltage supply, and a drain is coupled to the first output, and (3) a second control transistor having a gate coupled to an output of the first control inverter, a source coupled to the second voltage supply, and a drain coupled to a source of the third transistor.

In one example, the first transistor, the second transistor, and the first control transistor may be NMOS transistors, and the third transistor, the fourth transistor, and the second control transistor may be PMOS transistors. As another example, the first voltage supply may be a ground voltage supply, the second voltage supply may be a high voltage supply, and the third voltage supply may be a low voltage supply.

As another example, the first control circuit may be powered by the second voltage supply. As another example, the input node may receive an input from a low voltage circuit and one of the first output and the second output may provide an output to a high voltage circuit.

As another example, the first control transistor may force the first output to a known voltage when the first control transistor is enabled. In this respect, the known voltage may be a voltage level of the first voltage supply. As another example, the second control transistor may disconnect the third transistor from the second voltage supply when the second control transistor is disabled.

As another example, the input of the first control inverter may be coupled directly to the third voltage supply.

The level shift circuit may further include a second control circuit coupled between the third voltage supply and the first control circuit. In one example, the second control circuit may include (1) a second control inverter having an input coupled to the third voltage supply, (2) one or more diodes coupled between the second control inverter and a voltage supply of the second control inverter, and (3) a third control inverter having an input coupled to an output of the second control inverter and an output coupled to an input of the first control inverter.

In one example, the second control circuit may provide an amplified version of the third voltage supply to the input of the first control inverter. In another example, the second control circuit may further include a capacitor coupled between the third voltage supply and the input of the first control inverter.

In another example, the third control inverter may be coupled directly to a voltage supply of the third control inverter. In an alternative example, the second control circuit may further include one or more diodes coupled between the third control inverter and a voltage supply of the third control inverter.

In another example, the second control circuit may be powered by the second voltage supply, and the voltage supply of the second control inverter and the voltage supply of the third control inverter may be the second voltage supply.

As another example, each of the one or more diodes may be diode-connected transistors, and the first, second, and third control inverters may be CMOS inverters. In this respect, the CMOS inverters may include an NMOS transistor having a gate, a source, and a drain, and a PMOS transistor having a gate, a source, and a drain, where the gates of the NMOS transistor and the PMOS transistor are coupled together and form an input of the CMOS inverter, and the drains of the NMOS transistor and the PMOS transistor are coupled together and form an output of the CMOS inverter.

As an alternate example, the second control circuit coupled between the third voltage supply and the first control circuit may include (1) a second control inverter, where an input of the second control inverter is coupled to the third voltage supply, (2) one or more diodes coupled between the second control inverter and a voltage supply of the second control inverter, (3) a third control inverter, where an input of the third control inverter is coupled to an output of the second control inverter, (4) one or more diodes coupled between the third control inverter and a voltage supply of the third control inverter, (5) a fourth control inverter, where an input of the fourth control inverter is coupled to an output of the third control inverter, (6) one or more diodes coupled between the fourth control inverter and a voltage supply of the fourth control inverter, and, (7) a fifth control inverter, where an input of the fifth control inverter is coupled to an output of the fourth control inverter and an output of the fifth control inverter is coupled to an input of the first control inverter.

Another aspect of the present invention may take the form of a circuit for controlling a level shift circuit powered by a low voltage supply and a high voltage supply. The circuit may include (a) a first control inverter, where an input of the first control inverter is coupled to the low voltage supply, (b) one or more diodes coupled between the first control inverter and a voltage supply of the first control inverter, (c) a second control inverter, where an input of the second control inverter is coupled to an output of the first control inverter, (d) a third control inverter, where an input of the third control inverter is coupled to an output of the second control inverter, (e) a NMOS transistor having a gate, a source, and a drain, where the gate is coupled to a output of the third control inverter, the source is coupled to a ground voltage supply, and the drain is coupled to an output of the level shift circuit, and where the NMOS transistor forces the output of the level shift circuit to the ground voltage when the NMOS transistor is enabled; and, (f) a PMOS transistor having a gate, a source, and a drain, where the gate is coupled to an output of the third control inverter, the source is coupled to the high voltage supply, and the drain is coupled to a portion of the level shift circuit, and where the PMOS transistor disconnects the portion of the level shift circuit from the high voltage supply when the PMOS transistor is disabled.

In one example, the circuit may further include one or more diodes coupled between the second control inverter and a voltage supply of the second control inverter. In another example, the portion of the level shift circuit may be a transistor that is coupled to the output of the level shift circuit.

Yet another aspect of the present invention may take the form of a circuit that includes a control circuit and one or more level shift circuits coupled to the output of the control circuit. The control circuit may include (a) a first control inverter, where an input of the first control inverter is coupled to a low voltage supply, (b) one or more diodes coupled between the first control inverter its powering voltage supply, (c) a second control inverter, where an input of the second control inverter is coupled to an output of the first control inverter; and (d) a third control inverter, where an input of the third control inverter is coupled to an output of the second control inverter, and where an output of the third control inverter comprises an output of the control circuit.

Each of the level shift circuits may include (a) a first NMOS transistor having a gate, a source, and a drain, where the gate is coupled to a first input, the source is coupled to a ground voltage supply, and the drain is coupled to a first output, (b) a second NMOS transistor having a gate, a source, and a drain, where the gate is coupled to a second input having an inverted logic state of the first input, the source is coupled to the ground voltage supply, and the drain is coupled to a second output, (c) a first PMOS transistor having a gate, a source, and a drain, where the gate is coupled to the second output and the drain is coupled to the first output, (d) a second PMOS transistor having a gate, a source, and a drain, where the gate is coupled to the first output, the source is coupled to a high voltage supply, and the drain is coupled to the second output, (e) a third NMOS transistor having a gate, a source, and a drain, where the gate is coupled to the output of the control circuit, the source is coupled to the ground voltage supply, and the drain is coupled to the first output, and where the third NMOS transistor forces the first output to the ground voltage when the third NMOS transistor is enabled, and (f) a third PMOS transistor having a gate, a source, and a drain, where the gate is coupled to an output of the control circuit, the source is coupled to the high voltage supply, and the drain is coupled to the source of the first PMOS transistor, and where the third PMOS transistor disconnects the first PMOS transistor from the high voltage supply when the third PMOS transistor is disabled.

These as well as other aspects and advantages will become apparent to those of ordinary skill in the art by reading the following detailed description, with reference where appropriate to the accompanying drawings. Further, it should be understood that the embodiments described in this summary and elsewhere are intended to be examples only and do not necessarily limit the scope of the invention.

DETAILED DESCRIPTION

Figure 2:
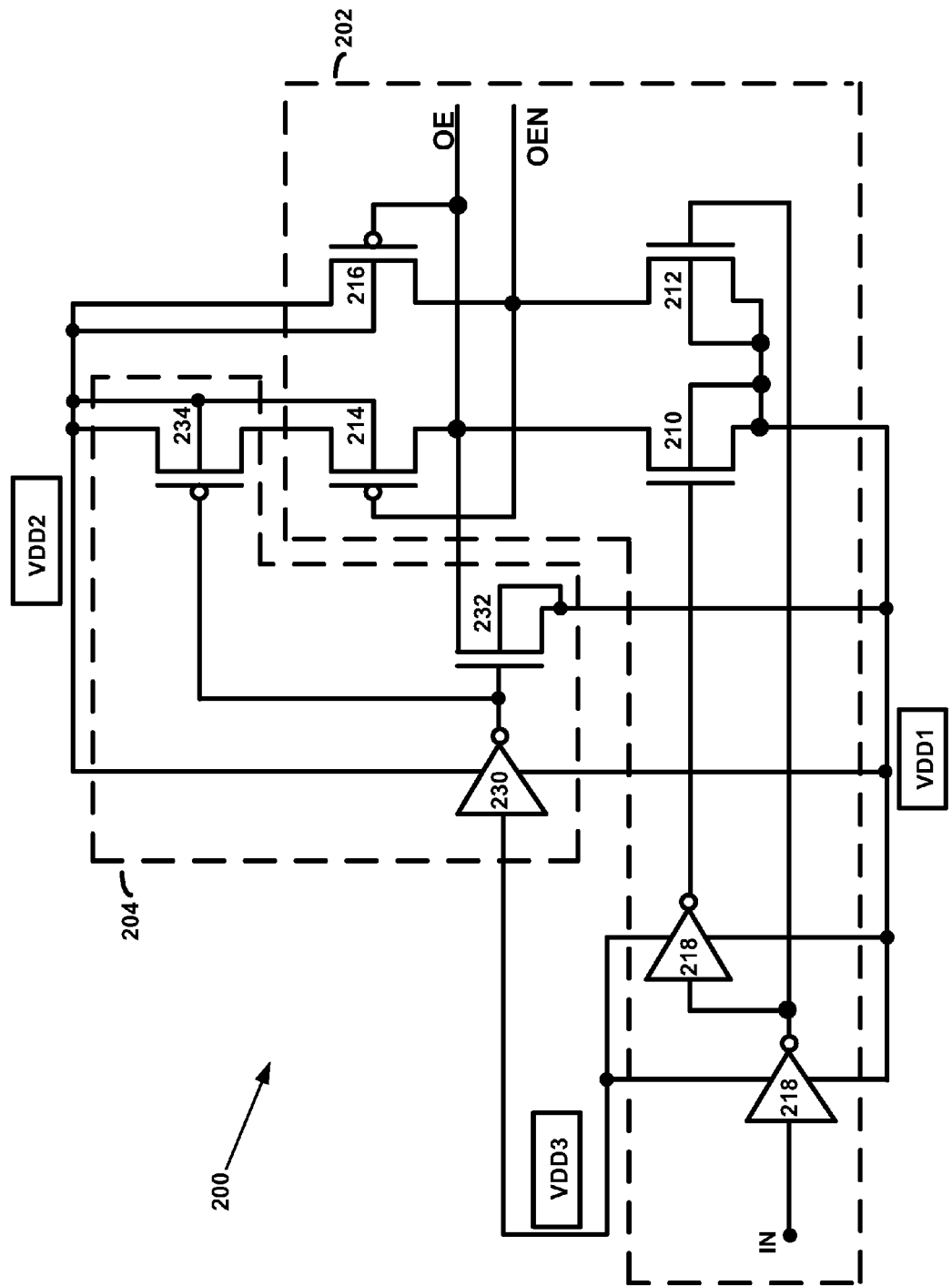
FIG. 2 is a schematic diagram of a level shift circuit, according to an example of the present invention.

Referring to the drawings, FIG. 2 is a schematic diagram of a level shift circuit 200, according to an example of the present invention. As shown, the level shift circuit 200 may include a traditional level shift circuit 202 and a first control circuit 204. Further, as shown, the first level circuit 200 may be coupled to a first voltage supply VDD1, a second voltage supply VDD2, and a third voltage supply VDD3. In a preferred example, the first voltage supply VDD1 will be a ground voltage supply with a voltage of VSS, the second voltage supply VDD2 will be a high voltage supply with a voltage of VH (e.g., 3.3 V) when fully powered, and the third voltage supply VDD3 will be a low voltage supply with a voltage of VL (e.g., 1.8 V) when fully powered. It should be understood, however, that negative voltage supplies may be used instead of positive voltage supplies, in which case the type of transistors described below may change (e.g., PMOS transistors may be changed to NMOS transistors and vice versa).

Figure 1:
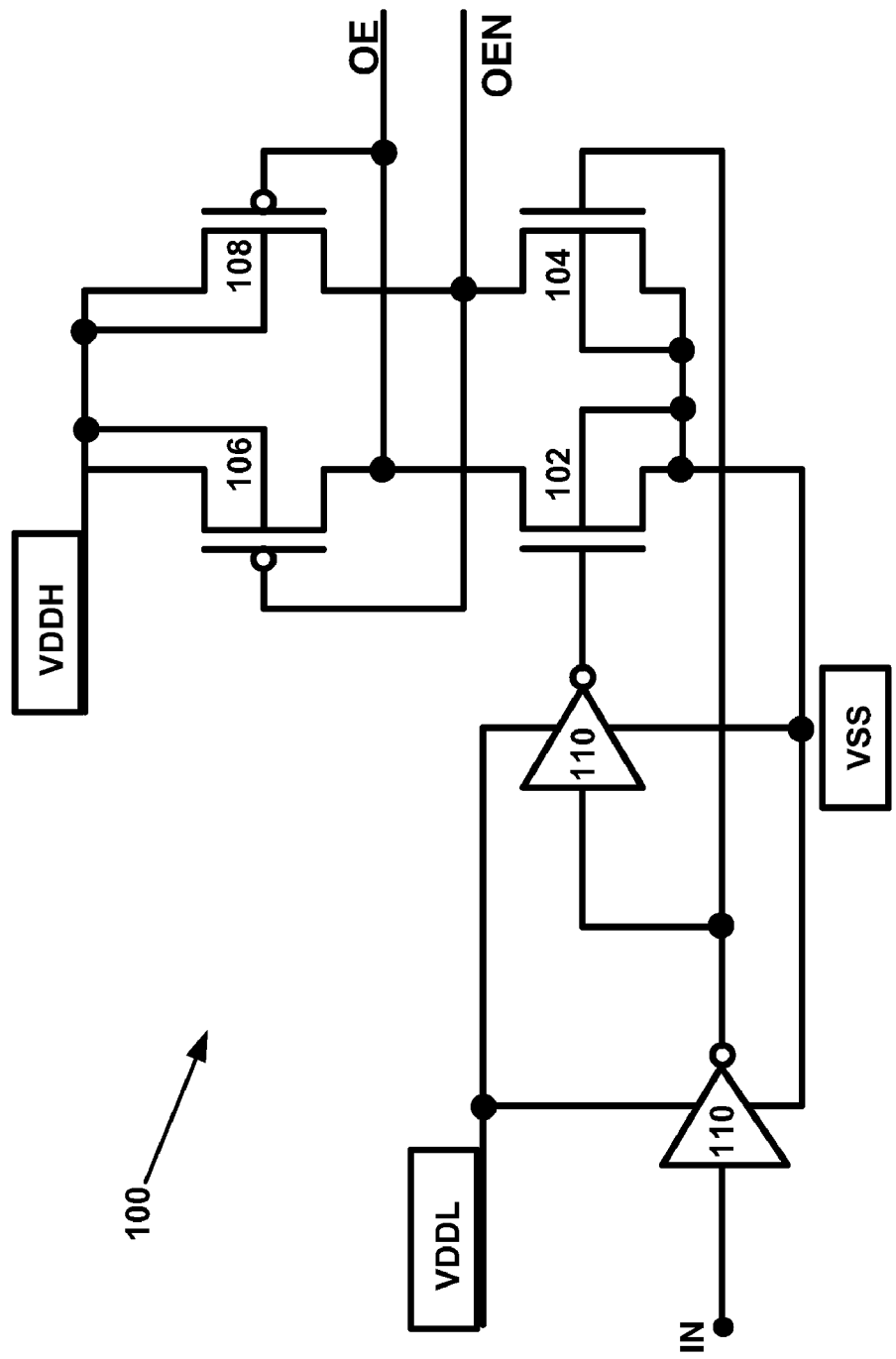
FIG. 1 is a schematic diagram of a typical level shift circuit.

The traditional level shift circuit 202 may be similar to the level shift circuit described with reference to FIG. 1. As such, the traditional level shift circuit 202 may include a first transistor 210, a second transistor 212, a third transistor 214, and a fourth transistor 216. Additionally, the traditional level shift circuit 202 may include one or more inverters 218. Additionally yet, the traditional level circuit 202 may have an input node IN that may receive low voltage signals, a first output node OE that may output high voltage signals, and a second output node OEN that may also output high voltage signals and has an opposite logic state of the first output node OE.

As shown, the first transistor 210 and second transistor 212 will preferably be NMOS transistors, and the third transistor 214 and fourth transistor 216 will preferably be PMOS transistors. (However, as described above, these transistors may have different types depending on the orientation of the power supplies.) As such, the first and second transistors 210 and 212 may be referred to as the first and second NMOS transistors 210 and 212, and the third and fourth transistors 214 and 218 may be referred to as the first and second PMOS transistors 214 and 216. Further, as shown, the transistors 210, 212, 214, and 216 will preferably be powered by the high voltage supply VDD2. Further yet, the one or more inverters 218 will preferably be powered by the low voltage supply VDD3.

The first NMOS transistor 210 may have a gate coupled to the input node IN, a source coupled to the ground voltage supply VDD1, and a drain coupled to the first output node OE. As shown, the gate may be coupled to the input node IN through a complementary pair of inverters 218, such that the first NMOS transistor 210 receives a non-inverted version of the input node IN. Alternatively, however, the gate of the first NMOS transistor 210 may be coupled directly to the input node IN. The second NMOS transistor 212 may have also a gate coupled to an inverted input node IN, a source coupled to the ground voltage supply VDD1, and a drain coupled the second output node OEN. As shown, the gate of the second NMOS transistor 212 may be coupled to the input node IN through a single inverter 218 coupled in series with the input node IN, such that the second NMOS transistor 212 receives an inverted version of the input node IN. Each of first and second NMOS transistors 210 and 212 may also have a body coupled to its source, and thus the ground voltage supply VDD1. It should also be understood that the inputs of the first and second NMOS transistor may be reversed.

The first PMOS transistor 214 may have a gate coupled to the second output node OEN, a source coupled to the high voltage supply VDD2 via the control circuit 204 (as described in more detail below), and a drain coupled to the first output node OE. The second PMOS transistor 216 may have a gate coupled to the first output node OE, a source coupled to the high voltage supply VDD2, and a drain coupled to the second output node OEN. Each of first and second PMOS transistors 214 and 216 may also have a body coupled to its source, and thus the high voltage supply VDD2.

As a result of the above configuration, the transistors 210, 212, 214, and 216 are cross-coupled. More particularly, the drain of the first NMOS transistor 210, the drain of the first PMOS transistor 214, and the gate of the second PMOS transistor 216 are coupled together at the first output node OE. Similarly, the drain of the second NMOS transistor 212, the drain of the second PMOS transistor 216, and the gate of the first PMOS transistor 214 are coupled together at the second output node OEN. Preferably, the NMOS transistors 210 and 212 in the cross-coupled configuration will have a larger drive capability than the PMOS transistors 214 and 216.

The first control circuit 204 may include at least a first control inverter 230, a first control transistor 232, and a second control transistor 234. The first control circuit 204 may include other components as well, such as a control capacitor (not shown). As shown, the first control transistor 232 will preferably be an NMOS transistor and the second control transistor 234 will preferably be a PMOS transistor. Further, as shown, the first control circuit 204 will preferably be powered by the high voltage supply VDD2.

The first control inverter 230 may have an input coupled to a non-inverted version of the low voltage supply VDD3 and an output coupled to gates of the first and second control transistors 232 and 234. In one example, as shown, the input of the first control inverter 230 may be coupled directly to the low voltage supply VDD3. In another example, the input of the first control inverter 230 may be coupled to the low voltage supply VDD3 via additional control circuitry that includes a complementary pair of inverters, as described in more detail with reference to FIGS. 4-5. The first control inverter 230 may also be coupled directly to its powering voltage supply, which is the high voltage supply VDD2. In this configuration, when the input of the first control inverter 230 is at a voltage level that meets or exceeds the control inverter's switch point voltage, which is approximately VDD2/2, the output of the first control inverter 230 may be at a logic "0" voltage of approximately VSS. Alternatively, when the input of the first control voltage 230 is at a voltage level that is below the control inverter's switch point voltage, the output of the first control inverter 230 may be at a logic "1" voltage of approximately VDD2.

As described above, the control NMOS transistor 232 may have a gate coupled to the output of the first control inverter 230. Further, the control NMOS transistor 232 may have a source coupled to the ground voltage supply VDD1. Further yet, the control transistor 232 may have a drain coupled to the traditional level shift circuit 202 at the output node OE which is also coupled to the drain of the first NMOS transistor 210, the drain of the first PMOS transistor 214, and the gate of the second PMOS transistor 216. The control NMOS transistor 232 may also have a body coupled to the ground voltage supply VDD1. According to this configuration, the control NMOS transistor 232 when enabled may function to force the first output node OE to a ground voltage of approximately VSS.

As described above, the control PMOS transistor 234 may also have a gate coupled to the output of the first control inverter 230. Further, the control PMOS transistor 234 may have a source coupled to the high voltage supply VDD2. Further yet, the control PMOS transistor 234 may have a drain coupled to the traditional level shift circuit 202 at the source of the first PMOS transistor 214, such that the first PMOS transistor 214 couples to the high voltage supply VDD2 via the control PMOS transistor 234. The control PMOS transistor 234 may also have a body coupled to the high voltage supply VDD2. According to this configuration, the control PMOS transistor 234 when disabled may function to disconnect the first PMOS transistor 214 from the high voltage supply VDD2.

Figure 3:
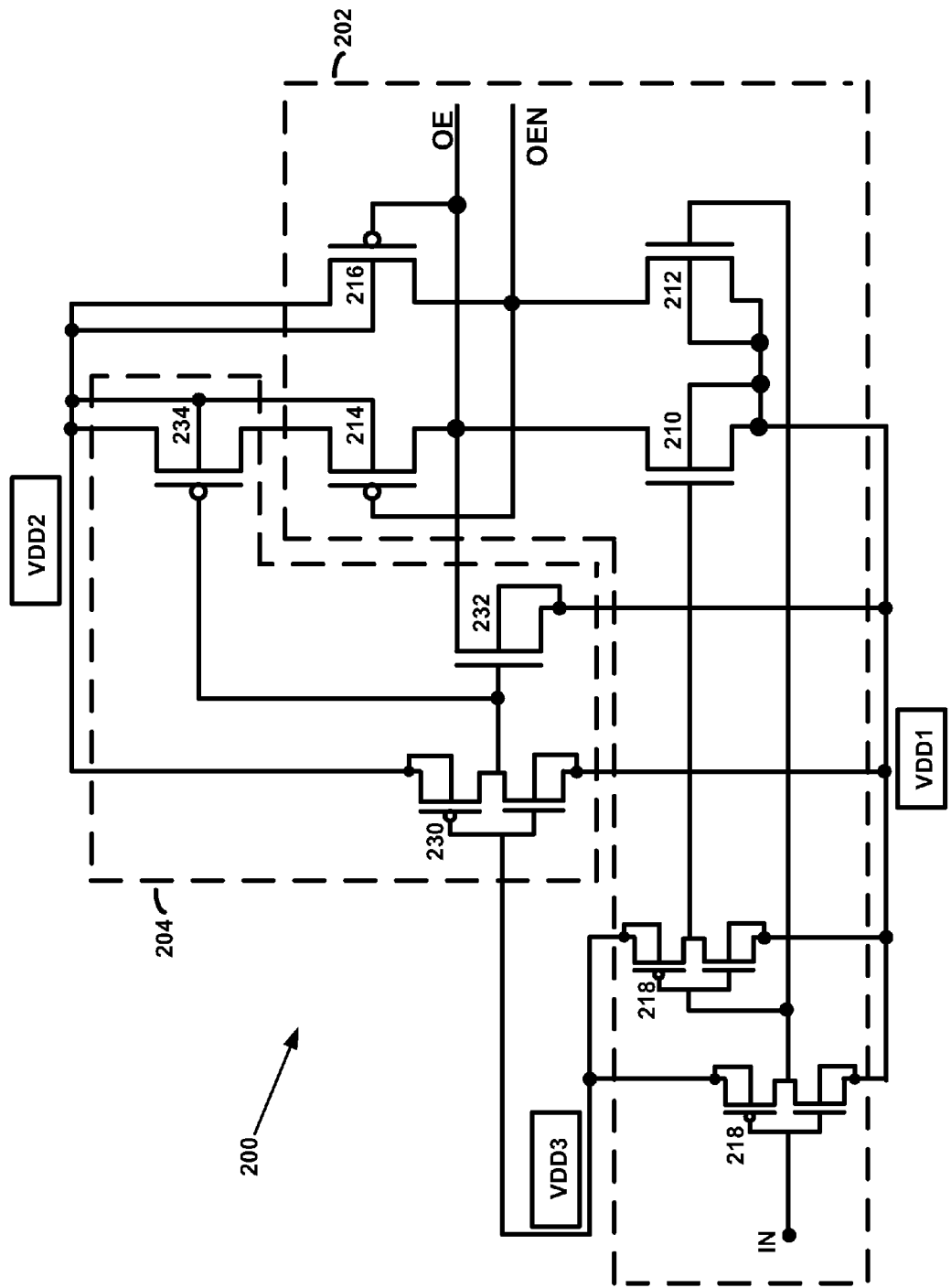
FIG. 3 is a more detailed schematic diagram of the level shift circuit of FIG. 2, according to an example of the present invention.

FIG. 3 is a more detailed schematic diagram of the level shift circuit 200 of FIG. 2, according to an example of the present invention. As shown, each of the inverters 218 and 230 of the level shift circuit 200 may be a CMOS inverter. More particularly, each of the inverters 218 and 234 may include an NMOS transistor coupled to a PMOS transistor. In this example, the gates of the NMOS and PMOS transistors may be coupled together to form an input of the inverter, the drains of the NMOS and PMOS transistors may be coupled together to form an output of the inverter, the source of the PMOS transistor may be coupled to a powering voltage supply (e.g., VDD2 or VDD3), and the source of the NMOS transistor may be coupled to the ground voltage supply VDD1.

Operation of the level shift circuit 200 of FIGS. 2 and 3 as the high voltage supply VDD2 is powering up and the low voltage supply VDD3 is powered down (i.e., at ground voltage VSS) will now be described. At time t0, the high voltage supply VDD2 may be at a ground voltage VSS, thus resulting in all devices in the level shift circuit 200 being unpowered and all nodes in the level shift circuit 200 being held at or near the ground voltage of VSS. At time t1, the high voltage supply VDD2 may then increase to a voltage $V_1$ that meets or exceeds a voltage that allows operation (i.e., the "operation voltage") of the first control inverter 230, thus turning on the first control inverter 230. The operation voltage of the first control inverter 230 may be a voltage of one PMOS transistor threshold, which may vary depending on the particular technology used. Once operational, the first control inverter 230 may invert the voltage of the low voltage supply VDD3 at its input, which is at a logic "0" voltage of VSS, to a high logic "1" voltage at its output, which is approximately the voltage level of the high voltage supply VDD2.

At time t2, the first control inverter's logic "1" output voltage may apply to the gates of the control NMOS transistor 232 and the control PMOS transistor 234, thus enabling the control NMOS transistor 232 and disabling the control PMOS transistor 234. In turn, at time t3, the enabled control NMOS transistor 232 may pull the first output node OE, and thus the gate of the second PMOS transistor 216, to the ground voltage of approximately VSS, while the disabled control PMOS transistor 234 may disconnect the first PMOS transistor 214 from the high voltage supply VDD2. At time t4, the ground voltage of approximately VSS at the gate of the second PMOS transistor 216 may enable the second PMOS transistor 216, and the enabled second PMOS transistor 216 may then pull the second output node OEN, and thus the gate of the first PMOS transistor 214, to the logic "1" voltage level of the high voltage supply VDD2. At time t5, the logic "1" voltage level at the gate of the first PMOS transistor 214 may disable the first PMOS transistor 214. As a result, the first output node OE may be stable at a logic "0" value in the high voltage domain of approximately VSS, and the second output node OEN may be stable at a logic "1" value in the high voltage domain of approximately VDD2.

Advantageously, the level shift circuit 200 of FIGS. 2 and 3 may provide stable, predictable voltages at output nodes OE and OEN when the high voltage supply VDD2 is powering up and the low voltage supply VDD3 is turned off (i.e., at the ground voltage VSS). The level shift circuit 200, and more particularly the first control circuit 204, may force the output nodes OE and OEN to the appropriate voltage levels once the high voltage level VDD2 reaches the first control inverter's operation voltage.

However, depending on the difference between the voltage level VH of the high voltage supply VDD2 and the voltage level VL of the low voltage supply VDD3, DC current paths may exist in the control circuit 204 of the level shift circuit 200 after the high voltage supply VDD2 is fully powered. More particularly, DC current paths may exist while low voltage supply VDD3 is powering up or down, as well as when the low voltage supply VDD3 is fully powered. The DC current paths may result from the low voltage supply VDD3 outputting a voltage that is too low to turn off the PMOS transistor of the first control inverter 230 when the NMOS transistor of the first control inverter is turned on. These DC current paths may then result in increased power consumption of the level shift circuit 200. Accordingly, additional control circuitry may be desirable to reduce or eliminate these DC current paths.

Figure 4:
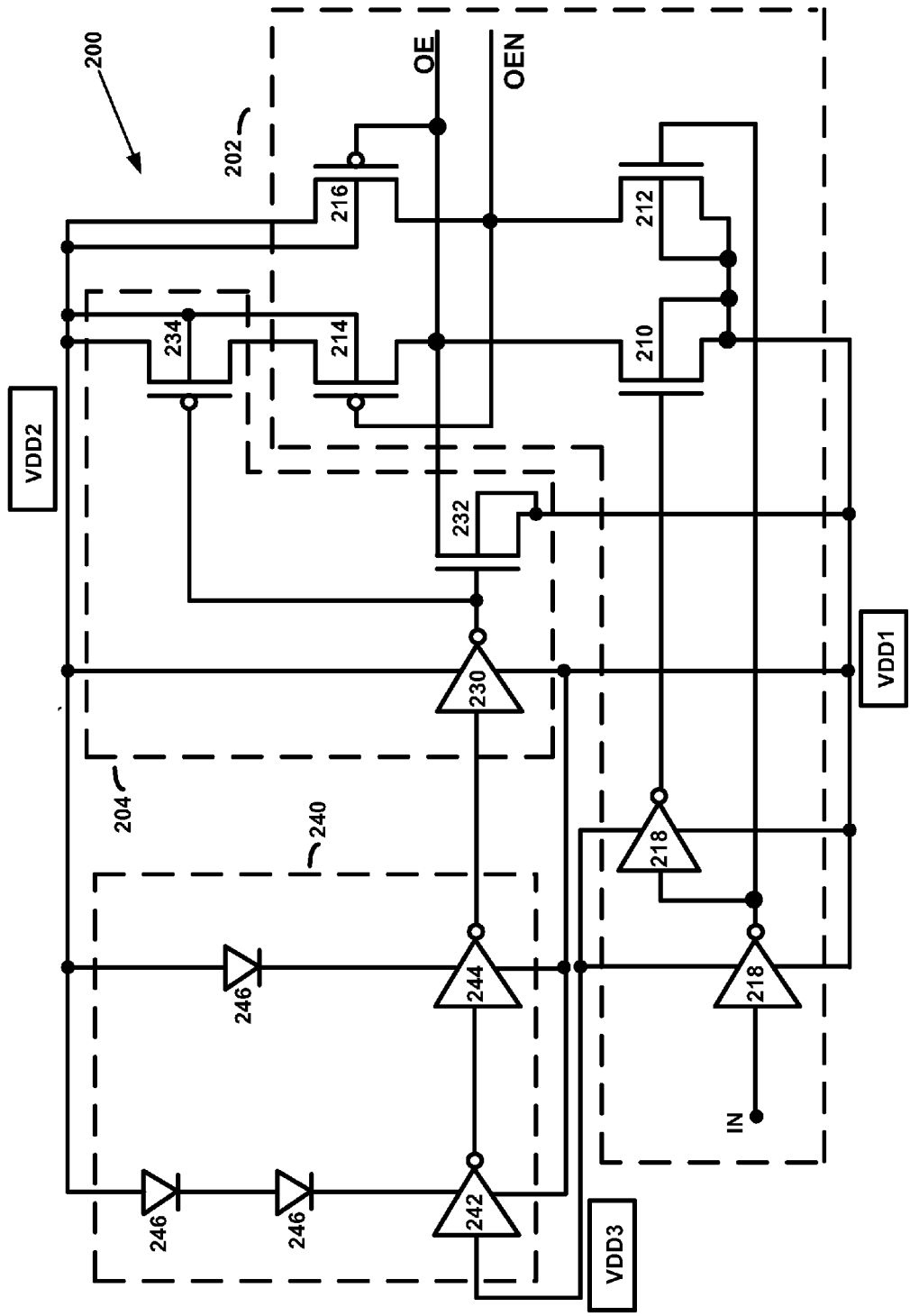
FIG. 4 is a schematic diagram of the level shift circuit of FIG. 2 with additional control circuitry, according to an example of the present invention.

FIG. 4 is a schematic diagram of the level shift circuit 200, according to another example of the present invention. As shown, in addition to the traditional level shift circuit 202 and the first control circuit 204, the level shift circuit 200 may also include a second control circuit 240. The second control circuit 240 may include at least a complementary pair of control inverters, shown as a second control inverter 242 and a third control inverter 244, and one or more diodes 246. The second control circuit 240 may include other components as well. As shown, the second control circuit 240 will preferably be coupled between the low voltage supply VDD3 and the first control circuit 204. In this respect, as described below, the second control circuit 240 may provide an amplified version of the low voltage supply VDD3 to the input of the first control inverter 230. Further, as shown, the second control circuit 240 will preferably be powered by the high voltage supply VDD2.

The second control inverter 242 may have an input coupled to the low voltage supply VDD3 and an output coupled to an input of the third control inverter 244. Further, the second control inverter 242 may be coupled to its voltage supply, which is the high voltage supply VDD2, via one or more diodes 246 (where $V_d$ is the voltage drop of a diode 246 and $A_2$ is a number of diodes 246 coupled between the second control inverter 242 and VDD2). As a result of the one or more diodes 246 coupled between the second control inverter 242 and the high voltage supply VDD2, the second control inverter 242 may have a lower switch point voltage than the first control inverter 230, such that a lower voltage at the input of the second control inverter 242 may be required to switch the output of the second control inverter 242 to a logic "0" voltage. Further, as a result of the one or more diodes 246 coupled between the second control inverter 242 and the high voltage supply VDD2, the second control inverter 242 may output a smaller logic "1" voltage than the first control inverter 230, such that the second control inverter's logic "1" output voltage may be approximately $VDD2-A_2*V_d$.

As described above, the third control inverter 244 may have an input coupled to the output of the second inverter 242. Further, the third control inverter 244 may have an output coupled to the input of the first control inverter 230, such that the input of first control inverter 230 is coupled to a non-inverted version of the low voltage supply VDD3 via the second and third control inverters 242 and 244 of the second control circuit 240. Additionally, the input of the first control inverter 230 may also be coupled to the low voltage supply VDD3 via a control capacitor, which may improve a response time for switching the first control inverter 230.

In one example, the third control inverter 244 may be coupled directly to its powering voltage supply, which is the high voltage supply VDD2. In another example, as shown, the third control inverter 244 may be coupled to its powering voltage supply via one or more diodes 246 (where $V_d$ is the voltage drop of a diode 246 and $A_3$ is a number of diodes 246 coupled between the third control inverter 244 and VDD2). In this respect, the number of diodes 246 coupled between the third control inverter 244 and the high voltage supply VDD2 will preferably be less than or equal to the number of diodes 246 coupled between the second control inverter 242 and the high voltage supply VDD2 (i.e., $A_2>A_3$). In a preferred example, as shown, there will be one diode 246 coupled between the third control inverter 244 and VDD2 and two diodes 246 coupled between the second control inverter 242 and VDD2.

As a result of the one or more diodes 246 coupled between the third control inverter 244 and the high voltage supply VDD2, the third control inverter 244 may have a lower invert switch point voltage than the first control inverter 230, such that a lower voltage at the input of the third control inverter 244 may be required to force the output of the third control inverter 244 to a logic "0" voltage. However, because the number of diodes 246 coupled to the third control inverter 244 will preferably be less than the number of diodes 246 coupled to the second control inverter 242, the voltage required to force the output of the third control inverter 244 to a logic "0" voltage may still be higher than for the second control inverter 242. Further, as a result of the one or more diodes 246 coupled between the third control inverter 244 and the high voltage supply VDD2, the third control inverter 244 may output a lower logic "1" voltage than the first control inverter 230 (e.g, the third control inverter's logic "1" output voltage may be approximately $VDD2-A_3*V_d$). However, because the number of diodes 246 coupled to the third control inverter 244 will preferably be less than the number of diodes 246 coupled to the second control inverter 242, the third control inverter's logic "1" output voltage may still be higher the second control inverter's logic "1" output voltage.

Although not shown, the third control inverter 244 may alternatively be coupled directly to its powering voltage supply, which is the high voltage supply VDD2. In this configuration, when the output of the second control inverter 242 (and thus the input of the third control inverter 244) is at a voltage level that meets or exceeds the third control inverter's switch point voltage, which is approximately VH/2 when VDD2 is powered up, the output of the third control inverter 244 may be at a logic "0" voltage (e.g., VSS). Alternatively, when the output of the second control inverter 242 (and thus the input of the third control inverter 244) is at a voltage level that is below the third control inverter's switch point voltage, the output of the third control inverter 230 may be at a logic "1" voltage (e.g., approximately VH when VDD2 is powered up).

Figure 5:
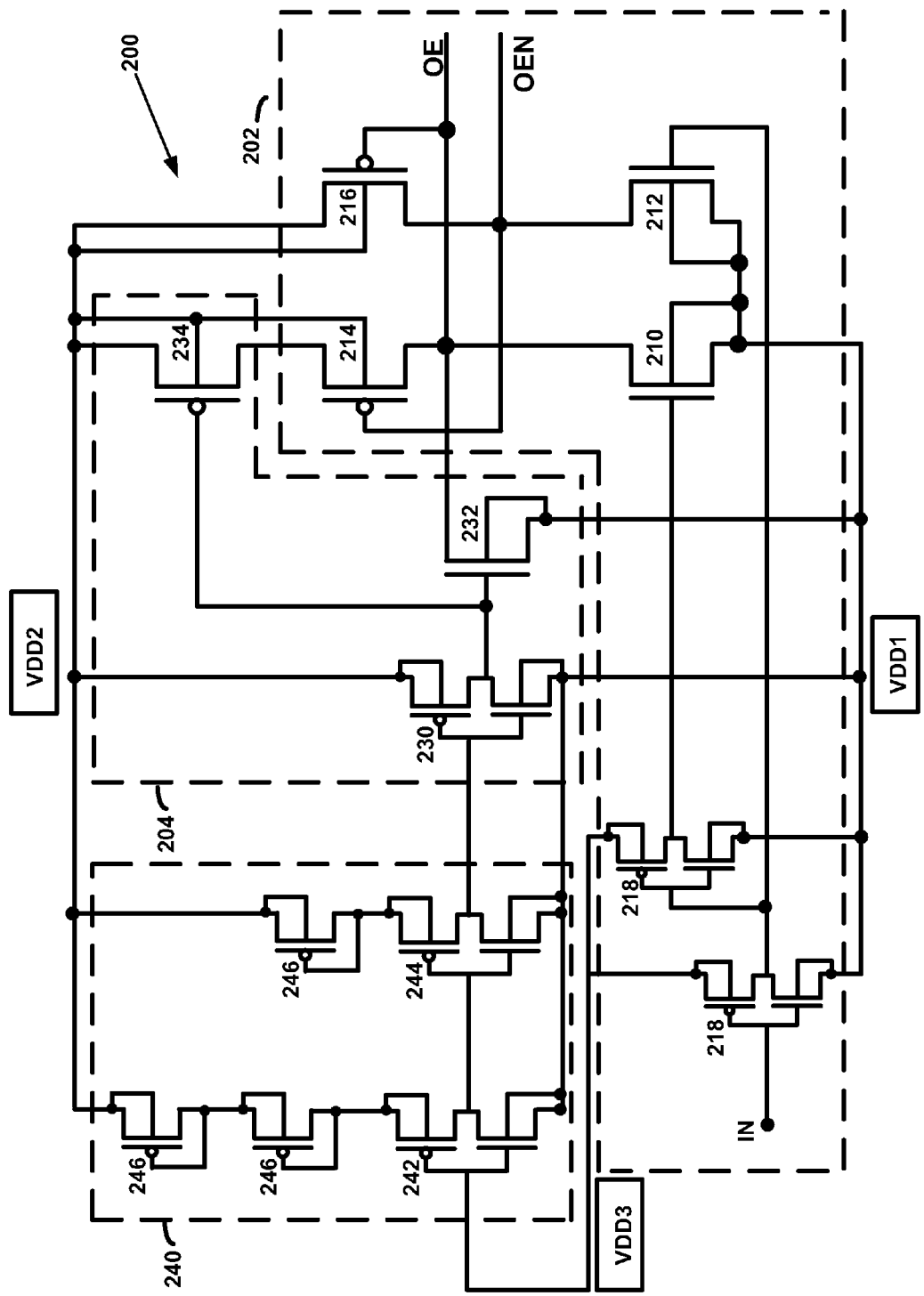
FIG. 5 is a more detailed schematic diagram of the level shift circuit of FIG. 4, according to an example of the present invention.

FIG. 5 is a more detailed schematic diagram of the level shift circuit 200 of FIG. 4, according to an example of the present invention. As shown, each of the inverters 218, 230, 242, and 244 of the level shift circuit 200 may be a CMOS inverter. More particularly, each of the inverters 218, 230, 242, and 244 may include an NMOS transistor coupled to a PMOS transistor. In this example, the gates of the NMOS and PMOS transistors may be coupled together to form an input of the inverter, the drains of the NMOS and PMOS transistors may be coupled together to form an output of the inverter, the source of the PMOS transistor may be coupled to powering voltage supply (e.g., VDD2 or VDD3), and the source of the NMOS transistor may be coupled to the ground voltage supply VDD1. Further, as shown, each the diodes 246 of the level shift circuit 200 may be a diode-connected PMOS transistor, which has a gate coupled to a drain.

Although not shown, the second control circuit 240 of FIGS. 4 and 5 may further include a second complementary pair of inverters coupled between the low voltage supply VDD3 and the first control circuit 204. According to this example, the second complementary pair of inverters may also be powered by the high voltage supply VDD2, and the second complementary pair of inverters may each couple to the high voltage supply VDD2 via a plurality of diodes 246. In this respect, the number of diodes 246 coupled between the second complementary pair of inverters and the high voltage supply VDD2 will preferably be greater than the number of diodes 246 coupled between the first complementary pair of inverters and the high voltage supply VDD2, such that the low voltage supply VDD3 may switch the second complementary pair of inverters at a lower voltage level than the first complementary pair of inverters.

Additionally, it should be understood that the grouping of elements of the level shift circuit 200 into the traditional level circuit 202, the first control circuit 204, and the second control circuit 240 is merely exemplary, and that these elements may grouped differently to more efficiently implement the circuit 200. As one example, the elements of the first control 204 and the second control circuit 240 may be combined into a single control circuit. As another example, the elements of the level shift circuit 200 may be grouped such that the control transistors 232 and 234 are implemented as part of the traditional level shift circuit 202, and the control circuit may then include the control inverters 230, 242, and 244 and the diodes 246. In this respect, a single control circuit may then couple to, and thus control, a plurality of traditional level shift circuits 202 that are modified to include the control transistors 232 and 234. Other implementations of the elements of the circuit 200 may exist as well.

Operation of the level shift circuit 200 of FIGS. 4 and 5 as the high voltage supply VDD2 is powering up and the low voltage supply VDD3 is powered down (i.e., at ground voltage VSS) will now be described. At times t0 to t5, the level shift circuit 200 of FIGS. 4 and 5 may operate substantially similarly to the level shift circuit 200 of FIGS. 2 and 3. In this respect, during times t0 to t5, the second and third control inverters 242 and 244 will preferably be non-operational, and as such the input of the first control inverter 230 will still be at a logic "0" voltage of VSS. As a result, after time t5, the first output node OE may be stable at a logic "0" value in the high voltage domain of approximately VSS, and the second output node OEN may be stable at a logic "1" value in the high voltage domain of approximately VDD2.

At time t6, the high voltage supply VDD2 may reach a voltage that meets or exceeds an operation voltage of the third control inverter 244, thus turning on the third inverter 244. Because the third control inverter 244 is coupled to the high voltage supply VDD2 via one or more diodes 246, and preferably one diode 246, the operation voltage of the third control inverter 244 may be $A_3 * V_d$ greater than the operation voltage of the first control inverter 230. Once operational, the third control inverter 244 may invert the voltage at its input, which may be a logic "0" voltage of approximately VSS because the second control inverter 242 is disabled, to a logic "1" voltage at its output, which may be a voltage of approximately VDD2−$A_3 * V_d$.

At time t7, the logic "1" output voltage of the third control inverter 244 may apply to the input of the first control inverter 230, thus causing the first control inverter 230 to invert this logic "1" at its input to a logic "0" voltage of VSS at its output.

At time t8, the logic "0" output voltage of the first control inverter 230 may apply to the gates of the control NMOS transistor 232 and the control PMOS transistor 234, thus disabling the control NMOS transistor 232 and enabling the control PMOS transistor 234. However, because the first PMOS transistor 214 remains disabled and the second PMOS transistor 216 remains enabled, the changed states of the control transistors 232 and 234 may not change the output nodes OE and OEN. Accordingly, the first output node OE may remain stable at a logic "0" voltage in the high voltage domain of approximately VSS, and the second output node OEN may remain stable at a logic "1" voltage in the high voltage domain of approximately VDD2.

At time t9, the high voltage supply VDD2 may then reach a voltage that meets or exceeds an operation voltage of the second control inverter 242, thus turning on the second control inverter 242. Because the second control inverter 242 is coupled to the high voltage supply VDD2 via one or more diodes 246, and preferably two diodes 246, the operation voltage of the second control inverter 242 may be $A_2 * V_d$ greater than the operation voltage of the first control inverter 230 and $(A_2 - A_3) * V_d$ greater than the operation voltage of the third control inverter 244. Once operational, second control inverter 242 may invert the voltage of the low voltage supply VDD3 at its input, which may be a logic "0" voltage of approximately VSS, to a logic "1" voltage at its output, which may be a voltage of approximately VDD2−$A_2 * V_d$.

At time t10, the logic "1" output voltage of the second control inverter 242 may apply to the input of the third control inverter 244, thus causing the third control inverter 244 to invert this logic "1" voltage to a logic "0" output voltage of approximately VSS. In turn, at time t11, the logic "0" output voltage of the third control inverter 244 may apply to the input of the first control inverter 230, thus causing the first control inverter 230 to invert this logic "0" voltage to a logic "1" output voltage of approximately VDD2.

At time t12, the first control inverter stage's logic "1" output voltage of approximately VDD2 may apply to the gates of the control NMOS transistor 232 and the control PMOS transistor 234, thus enabling the control NMOS transistor 232 and disabling the control PMOS transistor 234. However, because the first output node OE, and thus the gate of the second PMOS transistor 216, is already at a logic "0" voltage of approximately VSS, the changed states of the control transistors 232 and 234 may not change the output nodes OE and OEN. Accordingly, the first output node OE may remain stable at a logic "0" value in the high domain of approximately VSS, and the second output node OEN may remain stable at a logic "1" value in the high voltage domain of approximately VDD2.

Operation of the level shift circuit 200 of FIGS. 4 and 5 with the high voltage supply VDD2 fully powered (i.e., at its maximum voltage of $V_H$) and the low voltage supply VDD3 powering up will now be described. It should be understood that as the low voltage supply VDD3 powers up, the level shift circuit 200 may become operational to shift a low voltage value at the input node IN to high voltage values at the output nodes OE and OEN. In this respect, for purposes of illustration, the following description will assume that the input node IN is at a logic "1" value in the low voltage domain of approximately VSS, resulting in a logic "0" value in the high voltage domain of approximately VSS at the first output node OE and a logic "1" value in the high voltage domain of approximately VDD2 at second output node OEN once the level shift circuit 200 becomes operational.

At time t0, the low voltage supply VDD3 may be at a ground voltage of approximately VSS, and the level shift circuit 200 may be in a state that is substantially similar to the state described at time t12 above. As such, the devices of the level shift circuit 200 powered by the high voltage supply VDD2 may all be operational, the output node OE may be stable at a logic "0" value in the high voltage domain of approximately VSS, and the output node OEN may be stable at a logic "1" value in the high voltage domain of approximately VDD2.

At time t1, the low voltage supply VDD3 may reach a voltage that meets or exceeds the switch point voltage of the second control inverter 242, which may be approximately $(VDD2-A_2*V_d)/2$. As a result, the second control inverter 242 may switch its output from a logic "1" voltage of approximately $VDD2-A_2*V_d$ to a logic "0" voltage of approximately VSS. At time t2, the logic "0" output voltage of the second control inverter 242 may then apply to the input of the third control inverter 244, thus causing the third control inverter 244 to switch its output from a logic "0" voltage of VSS to a logic "1" voltage of $VDD2-A_3*V_d$. At time t3, the logic "1" output voltage of the third control inverter 244 may apply to the input of the first control inverter 230. The third control inverter's logic "1" output voltage will preferably meet or exceed the switch point voltage of the first control inverter 230, and as such the first control inverter 230 may switch its output from a logic "1" voltage of VDD2 to a logic "0" voltage of approximately VSS.

At time t4, the logic "0" output voltage of the first control inverter 230 may apply to the gates of the control NMOS transistor 232 and the control PMOS transistor 234, thus disabling the control NMOS transistor 232 and enabling the control PMOS transistor 234. In this respect, the disabled control NMOS transistor 232 may effectively become disconnected from the traditional level shift circuit 202, the enabled control PMOS transistor 234 may connect the first PMOS transistor 214 to the high voltage supply VDD2, and the first control circuit 204 may effectively become transparent to the traditional level shift circuit 202. However, because the first PMOS transistor 214 remains disabled and the second PMOS transistor 216 remains enabled, the changed states of the control transistors 232 and 234 may not change the state of the output nodes OE and OEN.

After the control transistors 232 and 234 change states at time t4, the components and nodes of the first and second control circuits 204 and 240 may then remain constant until the high voltage supply VDD2 and/or the low voltage supply VDD3 are powering down. Thereafter, as long as the low voltage supply VDD3 is at a value that meets or exceeds an operation voltage of the inverters 218 in the traditional level shift circuit 202, the level shift circuit 200 may operate as a standard level shift circuit, with the first and second control circuits 204 and 240 being transparent to the level shifting operations of the level shift circuit 200.

Advantageously, the addition of the second control circuit 240 to the level shift circuit 200 effectively amplifies the output of the low voltage supply VDD3, thus allowing the low voltage supply VDD3 to switch the control inverter 230 without creating DC current. More particularly, the second control circuit 240 allows the low voltage supply VDD3 to disable the PMOS transistor of the first control inverter 230 at a lower voltage level, thus avoiding a situation where both transistors of the first control inverter 230 are enabled during normal (i.e. fully powered) operation of the level shift circuit 200. Further, the second control circuit 240 itself may not generate any DC current paths. Accordingly, the overall DC current of the level shift circuit 200 may be reduced during powering up/down of the low voltage supply VDD3, and may be completely eliminated during fully powered operation of the level shift circuit. As a result, the overall power consumption of the level shift circuit 200 may be reduced.

Exemplary embodiments of the present invention have been described above. Those skilled in the art will understand, however, that changes and modifications may be made to the embodiments described without departing from the true scope and spirit of the present invention, which is defined by the claims.

We claim:

1. A level shift circuit comprising:
   a first transistor having a gate, a source, and a drain, wherein the gate is coupled to a first input, the source is coupled to a first voltage supply, and the drain is coupled to a first output;
   a second transistor having a gate, a source, and a drain, wherein the gate is coupled to a second input, the source is coupled to the first voltage supply, and the drain is coupled to a second output, and wherein the second input has an inverted logic state of the first input;
   a third transistor having a gate, a source, and a drain, wherein the gate is coupled to the second output and the drain is coupled to the first output;
   a fourth transistor having a gate, a source, and a drain, wherein the gate is coupled to the first output, the source is coupled to a second voltage supply, and the drain is coupled to the second output; and
   a first control circuit comprising:
      a first control inverter having an input and an output, wherein the input is coupled to a non-inverted version of a third voltage supply;
      a first control transistor having a gate, a source, and a drain, wherein the gate is coupled to an output of the first control inverter, the source is coupled to the first voltage supply, and the drain is coupled to the first output; and
      a second control transistor having a gate, a source, and a drain, wherein the gate is coupled to the output of the first control inverter, the source is coupled to the second voltage supply, and the drain is coupled to the source of the third transistor.

2. The level shift circuit of claim 1, wherein the first transistor, the second transistor, and the first control transistor each comprise an NMOS transistor, the third transistor, the fourth transistor, and the second control transistor each comprise a PMOS transistor, the first voltage supply comprises a ground voltage supply, the second voltage supply comprises a high voltage supply, and the third voltage supply comprises a low voltage supply.

3. The level shift circuit of claim 1, wherein the first control circuit is powered by the second voltage supply.

4. The level shift circuit of claim 1, wherein the input node receives an input from a low voltage circuit, and wherein at least one of the first output and the second output provides an output to a high voltage circuit.

5. The level shift circuit of claim 1, wherein the first control transistor forces the first output to a known voltage when the first control transistor is enabled.

6. The level shift circuit of claim 5, wherein the known voltage comprises a voltage level of the first voltage supply.

7. The level shift circuit of claim 1, wherein the second control transistor disconnects the third transistor from the second voltage supply when the second control transistor is disabled.

8. The level shift circuit of claim 1, wherein the input of the first control inverter is coupled directly to the third voltage supply.

9. The level shift circuit of claim 1, further comprising a second control circuit coupled between the third voltage supply and the first control circuit, wherein the second control circuit comprises:
- a second control inverter, wherein an input of the second control inverter is coupled to the third voltage supply;
- one or more diodes coupled between the second control inverter and a voltage supply of the second control inverter; and
- a third control inverter, wherein an input of the third control inverter is coupled to an output of the second control inverter and an output of the third control inverter is coupled to an input of the first control inverter.

10. The level shift circuit of claim 9, wherein the second control circuit provides an amplified version of the third voltage supply to the input of the first control inverter.

11. The level shift circuit of claim 9, wherein the second control circuit further comprises a capacitor coupled between the third voltage supply and the input of the first control inverter.

12. The level shift circuit of claim 9, wherein the third control inverter is coupled directly to a voltage supply of the third control inverter.

13. The level shift circuit of claim 9, wherein the second control circuit further comprises one or more diodes coupled between the third control inverter and a voltage supply of the third control inverter.

14. The level shift circuit of claim 13, wherein the second control circuit is powered by the second voltage supply, and wherein the voltage supply of the second control inverter and the voltage supply of the third control inverter comprise the second voltage supply.

15. The level shift circuit of claim 10, wherein each of the one or more diodes comprises a diode-connected transistor, and wherein the first control inverter, the second control inverter, and the third control inverter each comprise a CMOS inverter that includes:
- an NMOS transistor having a gate, a source, and a drain; and
- a PMOS transistor having a gate, a source, and a drain,
- wherein the gates of the NMOS transistor and the PMOS transistor are coupled together and comprise an input of the CMOS inverter, and
- wherein the drains of the NMOS transistor and the PMOS transistor are coupled together and comprise an output of the CMOS inverter.

16. The level shift circuit of claim 1, further comprising a second control circuit coupled between the third voltage supply and the first control circuit, wherein the second control circuit comprises:
- a second control inverter, wherein an input of the second control inverter is coupled to the third voltage supply;
- one or more diodes coupled between the second control inverter and a voltage supply of the second control inverter;
- a third control inverter, wherein an input of the third control inverter is coupled to an output of the second control inverter;
- one or more diodes coupled between the third control inverter and a voltage supply of the third control inverter;
- a fourth control inverter, wherein an input of the fourth control inverter is coupled to an output of the third control inverter;
- one or more diodes coupled between the fourth control inverter and a voltage supply of the fourth control inverter; and
- a fifth control inverter, wherein an input of the fifth control inverter is coupled to an output of the fourth control inverter and an output of the fifth control inverter is coupled to an input of the first control inverter.

17. A circuit for controlling a level shift circuit, wherein the level shift circuit is powered by a low voltage supply and a high voltage supply, the circuit comprising:
- a first control inverter, wherein an input of the first control inverter is coupled to the low voltage supply;
- one or more diodes coupled between the first control inverter and a voltage supply of the first control inverter;
- a second control inverter, wherein an input of the second control inverter is coupled to an output of the first control inverter;
- a third control inverter, wherein an input of the third control inverter is coupled to an output of the second control inverter;
- an NMOS transistor having a gate, a source, and a drain, wherein the gate is coupled to a output of the third control inverter, the source is coupled to a ground voltage supply, and the drain is coupled to an output of the level shift circuit, and wherein the NMOS transistor forces the output of the level shift circuit to the ground voltage when the NMOS transistor is enabled; and
- a PMOS transistor having a gate, a source, and a drain, wherein the gate is coupled to an output of the third control inverter, the source is coupled to the high voltage supply, and the drain is coupled to a portion of the level shift circuit, and wherein the PMOS transistor disconnects the portion of the level shift circuit from the high voltage supply when the PMOS transistor is disabled.

18. The circuit of claim 17, further comprising one or more diodes coupled between the second control inverter and a voltage supply of the second control inverter.

19. The circuit of claim 17, wherein the portion of the level shift circuit comprises a transistor that couples to the output of the logic shift circuit.

20. A circuit comprising:
- a control circuit comprising:
  - a first control inverter, wherein an input of the first control inverter is coupled to a low voltage supply;
  - one or more diodes coupled between the first control inverter and a voltage supply of the first control inverter;
  - a second control inverter, wherein an input of the second control inverter is coupled to an output of the first control inverter; and
  - a third control inverter, wherein an input of the third control inverter is coupled to an output of the second control inverter, and wherein an output of the third control inverter comprises an output of the control circuit; and
- one or more level shift circuits coupled to the output of the control circuit, wherein each of the level shift circuits comprises:
  - a first NMOS transistor having a gate, a source, and a drain, wherein the gate is coupled to a first input, the source is coupled to a ground voltage supply, and the drain is coupled to a first output;
  - a second NMOS transistor having a gate, a source, and a drain, wherein the gate is coupled to second input, the source is coupled to the ground voltage supply, and the drain is coupled to a second output, and wherein the second input has an inverted logic state of the first input;

a first PMOS transistor having a gate, a source, and a drain, wherein the gate is coupled to the second output and the drain is coupled to the first output;

a second PMOS transistor having a gate, a source, and a drain, wherein the gate is coupled to the first output, the source is coupled to a high voltage supply, and the drain is coupled to the second output;

a third NMOS transistor having a gate, a source, and a drain, wherein the gate is coupled to the output of the control circuit, the source is coupled to the ground voltage supply, and the drain is coupled to the first output, and wherein the third NMOS transistor forces the first output to the ground voltage when the third NMOS transistor is enabled; and a third PMOS transistor having a gate, a source, and a drain, wherein the gate is coupled to an output of the control circuit, the source is coupled to the high voltage supply, and the drain is coupled to the source of the first PMOS transistor, and wherein the third PMOS transistor disconnects the first PMOS transistor from the high voltage supply when the third PMOS transistor is disabled.

* * * * *